(12) United States Patent
Tian (10) Patent No.: US 10,205,109 B2
(45) Date of Patent: Feb. 12, 2019

(54) CARBON NANOTUBE THIN FILM TRANSISTOR AND MANUFACTURING METHOD THEREOF

(71) Applicant: BOE TECHNOLOGY GROUP CO., LTD., Beijing (CN)

(72) Inventor: Xueyan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/518,664

(22) PCT Filed: Sep. 19, 2016

(86) PCT No.: PCT/CN2016/099306
§ 371 (c)(1),
(2) Date: Apr. 12, 2017

(87) PCT Pub. No.: WO2017/118093
PCT Pub. Date: Jul. 13, 2017

(65) Prior Publication Data
US 2018/0026214 A1    Jan. 25, 2018

(30) Foreign Application Priority Data

Jan. 8, 2016   (CN) .......................... 2016 1 0011912

(51) Int. Cl.
*H01L 51/05*   (2006.01)
*H01L 29/66*   (2006.01)
(Continued)

(52) U.S. Cl.
CPC .......... *H01L 51/0562* (2013.01); *H01L 29/66* (2013.01); *H01L 29/786* (2013.01);
(Continued)

(58) Field of Classification Search
CPC .......... H01L 29/0669–29/068; H01L 29/0665; H01L 2924/13061;
(Continued)

(56) References Cited

U.S. PATENT DOCUMENTS

2006/0240605 A1   10/2006   Moon et al.
2012/0112346 A1   5/2012    Ning
(Continued)

FOREIGN PATENT DOCUMENTS

CN   102027612 A   4/2011
CN   102610754 A   7/2012
(Continued)

OTHER PUBLICATIONS

Search Report issued by the Chinese Patent Office dated May 11, 2016.
(Continued)

*Primary Examiner* — Tucker J Wright
(74) *Attorney, Agent, or Firm* — Dilworth & Barrese, LLP; Michael J. Musella, Esq.

(57) ABSTRACT

A carbon nanotube thin film transistor and a manufacturing method thereof are provided in the embodiments of the present disclosure. The carbon nanotube thin film transistor includes: a base substrate; a gate electrode, a semiconductor layer, a source electrode and a drain electrode, which are disposed on the base substrate, the semiconductor layer includes a poly(3-hexylthiophene) layer and a mixing layer of semiconducting carbon nanotube and poly(3-hexylthiophene) which are stacked. The semiconducting carbon nanotube thin film transistor has a high purity, thus the metallic carbon nanotubes are substantially cleared out and the electrical property of the thin film transistor is ensured, so that the manufactured carbon nanotube thin film transistor has good electrical properties.

18 Claims, 3 Drawing Sheets

(51) Int. Cl.
*H01L 29/786* (2006.01)
*H01L 51/00* (2006.01)

(52) U.S. Cl.
CPC ...... *H01L 51/0007* (2013.01); *H01L 51/0013* (2013.01); *H01L 51/0026* (2013.01); *H01L 51/0036* (2013.01); *H01L 51/0048* (2013.01); *H01L 51/0093* (2013.01); *H01L 51/0097* (2013.01); *H01L 51/052* (2013.01); *H01L 51/0545* (2013.01); *H01L 51/0558* (2013.01); *H01L 51/0566* (2013.01)

(58) Field of Classification Search
CPC .. H01L 29/7853–2029/7858; H01L 29/78687; H01L 29/786; H01L 29/78696; H01L 51/0562; Y10S 977/938

See application file for complete search history.

(56) References Cited

U.S. PATENT DOCUMENTS

| | | | |
|---|---|---|---|
| 2012/0187379 A1* | 7/2012 | Wu | C08K 3/04 257/40 |
| 2014/0124737 A1 | 5/2014 | Takei | |
| 2015/0096610 A1* | 4/2015 | Okubo | C07D 519/00 136/256 |
| 2015/0214496 A1 | 7/2015 | Kai et al. | |

FOREIGN PATENT DOCUMENTS

| | | |
|---|---|---|
| CN | 102714278 A | 10/2012 |
| CN | 105428401 A | 3/2016 |

OTHER PUBLICATIONS

Search Report and Written Opinion dated Nov. 28, 2016 from State Intellectual Property Office of the P.R. China.
Chinese Office Action dated Jun. 20, 2016.

* cited by examiner

CARBON NANOTUBE THIN FILM TRANSISTOR AND MANUFACTURING METHOD THEREOF

TECHNICAL FIELD

Embodiments of the present disclosure relate to a carbon nanotube thin film transistor and a manufacturing method thereof.

BACKGROUND

Carbon nanotube, as a one-dimensional nano-material, is light and has a perfect hexagonal structure. Carbon nanotubes exhibit many excellent mechanical, electrical and chemical properties, for example, a high current density (over 109 A/cm$^2$), a high thermal conductivity (about 6,600 W/m·K), and a high light transparency (over 90%). Owing to these remarkable properties, carbon nanotubes, in particular single-walled nanotubes, have been used in thin film transistors.

Figure 1:
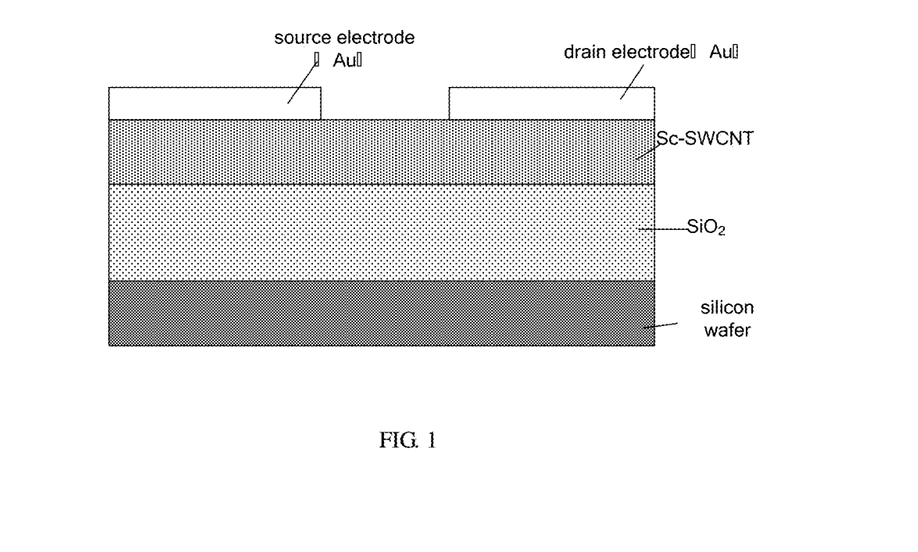
FIG. 1 is a schematic structure diagram of a carbon nanotube thin film transistor.

At present, carbon nanotube thin film transistors are generally made of heavily doped silicon wafers. As illustrated in FIG. 1, a silicon wafer is configured to function as both a base substrate and a gate electrode in the carbon nanotube thin film transistor, a layer of silicon dioxide disposed on the silicon wafer is configured to be a gate insulation layer, further a layer of carbon nanotubes disposed on the gate insulation layer is configured to be a semiconductor layer, and finally a source electrode and a drain electrode are manufactured on the active layer made of carbon nanotubes.

At present, the carbon thin film transistor is still in a stage of research and development, in order to ensure the performance of a device which comprises the carbon thin film transistor, a rigid substrate is employed, but the rigid substrate hinders its application in a flexible device. Furthermore, in the single-walled carbon nanotubes manufactured in the current methods, about two thirds of the carbon nanotubes are semiconducting and about one third of the carbon nanotubes are metallic, the coexistence of the semiconducting and the metallic carbon nanotubes greatly limits the electrical property of thin film transistors.

SUMMARY

Embodiments of the present disclosure provide a carbon nanotube thin film transistor and a manufacturing method thereof, and the carbon nanotube thin film transistor has good electrical properties.

At least one embodiment of the present disclosure provides a carbon nanotube thin film transistor, and the carbon nanotube thin film transistor comprises: a base substrate; a gate electrode, a semiconductor layer, a source electrode and a drain electrode, which are disposed on the base substrate; the semiconductor layer comprises a poly(3-hexylthiophene) layer and a mixing layer of semiconducting carbon nanotube and poly(3-hexylthiophene) which are stacked.

For example, in the carbon nanotube thin film transistor provided in one embodiment of the present disclosure, the base substrate is a flexible substrate.

For example, in the carbon nanotube thin film transistor provided in one embodiment of the present disclosure, the flexible substrate is a fibroin flexible substrate.

For example, in the carbon nanotube thin film transistor provided in one embodiment of the present disclosure, the mixing layer of semiconducting carbon nanotube and poly (3-hexylthiophene) is formed of semiconducting carbon nanotubes wrapped by the poly(3-hexylthiophene).

For example, in the carbon nanotube thin film transistor provided in one embodiment of the present disclosure, in the semiconducting carbon nanotubes wrapped by the poly(3-hexylthiophene), a purity of the semiconducting carbon nanotubes is equal to or greater than 99.9%.

For example, the carbon nanotube thin film transistor provided in one embodiment of the present disclosure, further comprises: an insulation layer disposed between the gate electrode and the semiconductor layer; the poly(3-hexylthiophene) layer is disposed between the insulation layer and the mixing layer of semiconducting carbon nanotube and poly(3-hexylthiophene).

For example, in the carbon nanotube thin film transistor provided in one embodiment of the present disclosure, the insulation layer is an organic insulation layer.

At least one embodiment of the present disclosure further provides a manufacturing method of a carbon nanotube thin film transistor, and the method comprises: preparing a base substrate; forming a gate electrode, a semiconductor layer, a source electrode, and a drain electrode on the base substrate. A process of forming the semiconductor layer comprises: preparing a poly(3-hexylthiophene) layer and a mixing layer of semiconducting carbon nanotube and poly(3-hexylthiophene), which are stacked on the base substrate.

For example, in the manufacturing method provided in one embodiment of the present disclosure, the process of forming the poly(3-hexylthiophene) layer comprises: dissolving poly(3-hexylthiophene) in an organic solvent, then applying onto the base substrate, vacuum annealing, standing in a vacuum condition at room temperature.

For example, in the manufacturing method provided in one embodiment of the present disclosure, the vacuum annealing is carried out at a temperature of 25° C. to 240° C. for 5 to 15 minutes.

For example, in the manufacturing method provided in one embodiment of the present disclosure, the process of standing is carried out in a vacuum condition at a room temperature for 20 to 30 hours.

For example, in the manufacturing method provided in one embodiment of the present disclosure, the process of preparing the mixing layer of semiconducting carbon nanotube and poly(3-hexylthiophene) comprises: dissolving single-walled carbon nanotubes and poly(3-hexylthiophene) in an organic solvent, ultrasonic mixing, centrifugation separating to form semiconducting carbon nanotubes wrapped by poly(3-hexylthiophene); and dissolving the semiconducting carbon nanotubes wrapped by poly(3-hexylthiophene) in an organic solvent, applying onto a surface of the poly(3-hexylthiophene) layer, and drying to obtain the mixing layer of semiconducting carbon nanotube and poly (3-hexylthiophene).

For example, in the manufacturing method provided in one embodiment of the present disclosure, a rotation speed of centrifugation separating is from 13,000 to 15,000 rpm and a time period of centrifugation separating is from 5 to 10 minutes.

For example, in the manufacturing method provided in one embodiment of the present disclosure, in the mixing layer of semiconducting carbon nanotube and poly(3-hexylthiophene), a purity of the semiconducting carbon nanotubes is equal to or greater than 99.9%.

For example, in the manufacturing method provided in one embodiment of the present disclosure, a volume ratio of the single-walled carbon nanotube to the poly(3-hexylthiophene) is from 8:1 to 15:1.

For example, in the manufacturing method provided in one embodiment of the present disclosure, the process of preparing the base substrate comprises: producing a fibroin flexible substrate on an elastic rubber in a solution method.

For example, the manufacturing method provided in one embodiment of the present disclosure, further comprises: peeling off the elastic rubber after the gate electrode, the semiconductor layer, the source electrode, and the drain electrode are formed.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Embodiments of the present disclosure provide a carbon nanotube thin film transistor, and the carbon nanotube thin film transistor comprises: a base substrate; a gate electrode, a semiconductor layer, a source electrode and a drain electrode, which are disposed on the base substrate; a poly(3-hexylthiophene) layer and a mixing layer of semiconducting carbon nanotube and poly(3-hexylthiophene) are stacked to form the semiconductor layer.

The semiconductor layer is improved in the embodiments of the present disclosure. In the present disclosure, the semiconductor layer includes a poly(3-hexylthiophene) (RR-P3HT) layer and a mixing layer of semiconducting carbon nanotube and poly(3-hexylthiophene) (Sc-SWCNT/RR-P3HT) which are stacked, for example, an insulation layer is disposed between the gate electrode and the semiconductor layer, and the poly(3-hexylthiophene) layer is disposed between the insulation layer and the mixing layer of semiconducting carbon nanotube and poly(3-hexylthiophene).

For example, the insulation layer is an organic insulation layer, and the material of the organic insulation layer, for example, is polymethylmethacrylate (PMMA). Compared with the inorganic insulation layer, the organic insulation layer has a greater interlayer bonding capacity with the semiconductor layer or the base substrate.

The semiconducting carbon nanotubes wrapped by the poly(3-hexylthiophene) are used to make the mixing layer of semiconducting carbon nanotube and poly(3-hexylthiophene), and the process for preparing the mixing layer of semiconducting carbon nanotube and poly(3-hexylthiophene) comprises: dissolving single-walled carbon nanotubes and poly(3-hexylthiophene) in an organic solvent, ultrasonic mixing, centrifugation separating to form semiconducting carbon nanotubes wrapped by poly(3-hexylthiophene); and dissolving the semiconducting carbon nanotubes wrapped by poly(3-hexylthiophene) in an organic solvent, applying (for example: coating) the mixture to a surface of the poly(3-hexylthiophene) layer, and drying to obtain the mixing layer of semiconducting carbon nanotube and poly(3-hexylthiophene).

For example, in the above-mentioned process, the semiconducting carbon nanotubes wrapped by poly(3-hexylthiophene) are single-walled carbon nanotubes, and a volume ratio of the single-walled carbon nanotubes to the poly(3-hexylthiophene) is from 8:1 to 15:1. A rotation speed of centrifugation separation is from 13,000 to 15,000 rpm and a time period of centrifugation separation is from 5 to 10 minutes. After centrifugation, poly(3-hexylthiophene) is selectively wrapped on the semiconducting carbon nanotubes, which naturally achieves the separation between semiconducting carbon nanotubes and metallic carbon nanotubes. In the obtained semiconducting carbon nanotubes wrapped by poly(3-hexylthiophene), the mass content of the semiconducting carbon nanotubes accounting for the total carbon nanotubes is equal to or greater than 99.9%, that is, the purity of the semiconducting carbon nanotubes is equal to or greater than 99.9%, so that the incorporation of metallic carbon nanotubes is effectively avoided.

The poly(3-hexylthiophene) layer is obtained, for example, by chronic film-forming treatment. The process of the chronic film-forming treatment comprises the following operations:

dissolving poly(3-hexylthiophene) in an organic solvent, then applying the solution onto the surface of the insulation layer, vacuum annealing, and standing in a vacuum condition at the room temperature. For example, the vacuum annealing is carried out at a temperature of 25° C. to 240° C., further, 100° C. to 200° C., for example, 150° C. The time period of vacuum annealing is from 5 to 15 minutes, further, 10 minutes. The time period of standing is from 20 to 30 hours. After the chronic film-forming treatment, the poly(3-hexylthiophene) layer exhibits a distinctly three-dimensional growth mode of conjugated microcrystalline lamellae to achieve self-organized growth in the self-growth of a poly(3-hexylthiophene) layer.

In an embodiment of the present disclosure, the poly(3-hexylthiophene) layer and the mixing layer of semiconducting carbon nanotube and poly(3-hexylthiophene) are connected through π-π bonds to form a three-dimensional channel of the semiconductor layer in a carbon nanotube thin film transistor, so that the manufactured carbon nanotube thin film transistor has good electrical properties.

In an embodiment of the present disclosure, the base substrate, for example, is a flexible substrate, which is a fibroin flexible substrate for example. Thin film transistors made of flexible substrates have fully flexible structures and thus are suitable for precision applications and measurement, particularly suitable for the fields of medical and wearable device, for example, the applications of medical monitoring and therapeutic devices in vitro or implanted in a human body.

In an embodiment of the present disclosure, other structures such as the gate electrode, the source electrode and the drain electrode are substantially consistent with those in a current thin film transistor. The material of the gate electrode, the source electrode and the drain electrode, for example, is palladium.

Figure 2:
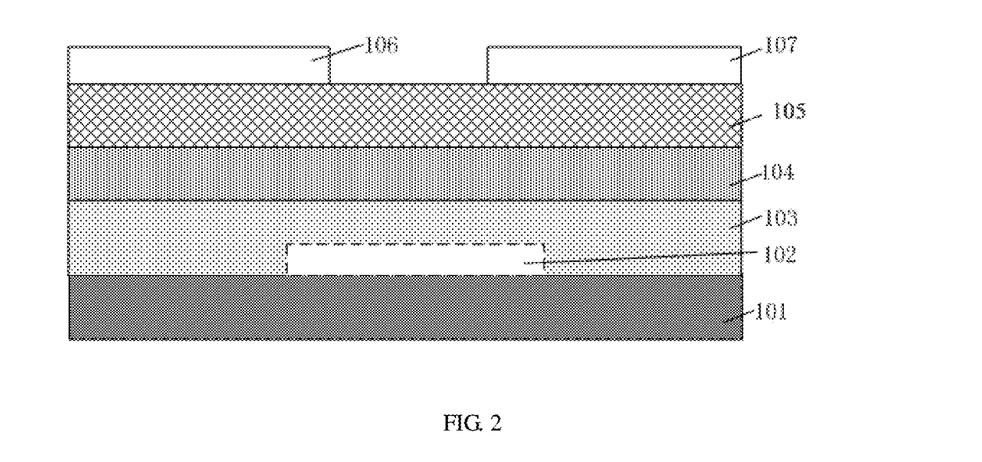
FIG. 2 is a schematic structure diagram of a carbon nanotube thin film transistor provided by an embodiment of the present disclosure.

The structure of the carbon nanotube thin film transistor provided by an embodiment of the present disclosure is illustrated in FIG. 2. In FIG. 2, 101 refers to the base substrate, 102 refers to the gate electrode, 103 refers to the organic insulation layer, 104 refers to the poly(3-hexylthiophene) layer (RR-P3HT), 105 refers to the mixing layer of semiconducting carbon nanotube and poly(3-hexylthiophene) (Sc-SWCNT/RR-P3HT), 106 refers to the source electrode, and 107 refers to the drain electrode.

An embodiment of the present disclosure further provides a manufacturing method of a carbon nanotube thin film transistor, and the method comprises: preparing a base substrate; forming a gate electrode, a semiconductor layer, a source electrode, and a drain electrode on the substrate; a process of forming the semiconductor layer comprises preparing a poly(3-hexylthiophene) layer and a mixing layer of semiconducting carbon nanotube and poly(3-hexylthiophene), which are stacked on the base substrate.

According to the content disclosed in the present disclosure, first, the substrate is prepared, the substrate, for example, is a flexible substrate, for example, the flexible substrate is a fibroin flexible substrate. The manufacturing method of the fibroin flexible substrate, for example is conducted as follows: producing the fibroin flexible substrate on an elastic rubber in a solution method. The elastic rubber, for example, is polydimethylsiloxane (PDMS). The fibroin flexible substrate manufactured in a solution method comprises the following operations:

A. degumming silk by boiling $NaCO_3$ solution with a concentration of 0.5%, and then washing and drying it by deionized water to remove sericin and other impurities to obtain pure fibroin fibers;
B. preparing LiBr solution, heating the solution in an oven at a temperature of 50° C. for 1 hour, placing the fibroin fibers prepared in step A in the solution, then further heating in the oven at a temperature of 50° C. for 1 hour, so as to obtain a fibroin solution;
C. filtering the solution by means of four layers of medical gauze and then putting it into a dialysis bag for dialysis;
D. repeatedly centrifuging the fibroin solution dialyzed in Step C twice to obtain a pure fibroin solution; and
E. applying (for example, coating) the pure fibroin solution manufactured above to an elastic rubber and then drying it in a fume hood to obtain a fibroin flexible substrate.

According to an embodiment of the present disclosure, after preparing the base substrate, the gate electrode is manufactured on the base substrate. The method of manufacturing the gate electrode is not particularly limited in the embodiments of the present disclosure, and the gate electrode may be prepared in a thermal evaporation method which is well known for those skilled in the art.

After forming the gate electrode, an organic insulation layer is formed on the surface of the gate electrode. The method of manufacturing the organic insulation layer is not particularly limited in the embodiments of the present invention, and the organic insulation layer may be prepared in a solution method which is well known for those skilled in the art.

Figure 3:
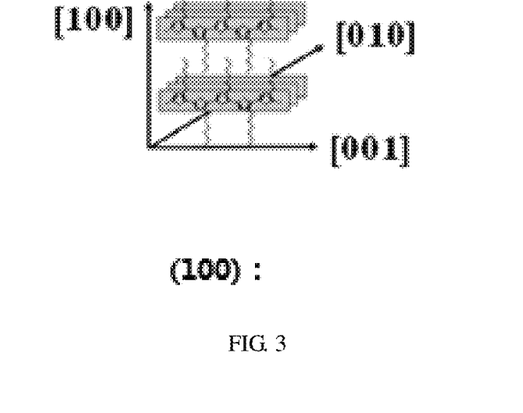
FIG. 3 is a principle diagram of a crystal phase description of a poly(3-hexylthiophene) layer.

After forming the organic insulation layer, a poly(3-hexylthiophene) layer is manufactured on the organic insulation layer. The method of forming the poly(3-hexylthiophene) layer, for example, comprises: dissolving poly(3-hexylthiophene) in an organic solvent with a concentration of, for example, 2 to 5 mg/L, preferable is 2.5 mg/L; applying (for example, coating) the solution formed by dissolving the poly(3-hexylthiophene) in an organic solvent to the surface of the insulation layer for vacuum annealing at a temperature of, for example, 25° C. to 240° C., preferable 100° C. to 200° C., for example, 150° C., for a period of, for example, 5 to 15 minutes, preferable 10 minutes; and allowing the solution to stand in a vacuum condition at room temperature for 20 to 30 hours to obtain the poly(3-hexylthiophene) layer. The organic solvent, for example, is chloroform, toluene or acetonitrile. After the chronic film-forming treatment, the poly(3-hexylthiophene) layer exhibits a distinctly three-dimensional growth mode of conjugated microcrystalline lamellae to achieve a self-organized growth in the self-growth of a poly(3-hexylthiophene) layer. FIG. 3 is the principle diagram of the crystal phase description of the poly(3-hexylthiophene) layer.

Figure 4:
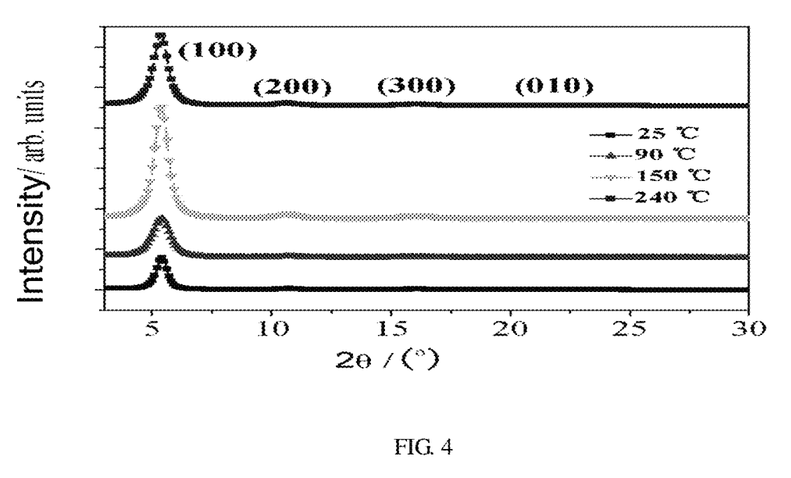
FIG. 4 is a GIXRD spectrum of an organic polymer RR-P3HT layer prepared by a chronic film-forming method provided by an embodiment of the present disclosure.

FIG. 4 is a GIXRD spectrum of the organic polymer RR-P3HT layer (the solution concentration is 2.5 mg/ml upon preparation of the RR-P3HT layer) prepared in a chronic film-forming method (synchrotron radiation grazing incidence X-ray diffraction technique, out-of-plane mode, grazing incidence angle $\alpha=0.30°$). It can be observed from FIG. 4, the organic polymer RR-P3HT layers treated under different annealing temperature conditions (for example, 25° C., 90° C., 150° C., and 240° C.) all lead to the (100) diffraction peak ($2\theta=5.40°$, $2\theta=5.40°$, $2\theta=5.35°$, $2\theta=5.35°$; the corresponding surface distances are d=16.35 Å, d=16.35 Å, d=16.51 Å, d=16.51 Å respectively), the (200) diffraction peak, the (300) diffraction peak, and the (010) diffraction peak. Moreover, it can be seen from FIG. 4, the amplitude of the (100) diffraction peak of the sample gradually increases as the annealing temperature is raised. The experimental results show that, in a nitrogen atmosphere, the three-dimensional microcrystalline lamellae have a good grain structure after thermal annealing at the temperature of 150° C. The organic polymer RR-P3HT layer formed by this chronic film-forming treatment exhibits a distinctly three-dimensional growth mode of conjugated microcrystalline lamellae to achieve a self-organization mechanism in the self-growth of the RR-P3HT layer.

Figure 5:
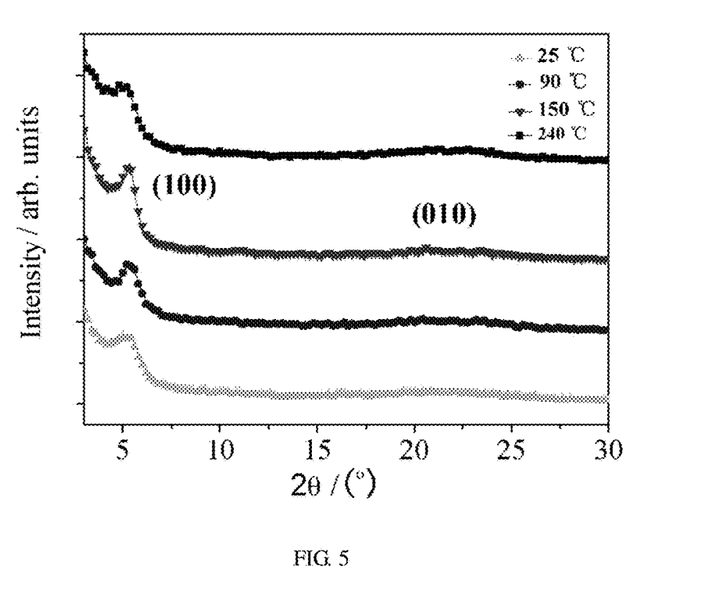
FIG. 5 is a GIXRD spectrum of an organic polymer RR-P3HT layer prepared by a conventional film-forming method provided by an embodiment of the present disclosure.

FIG. 5 is a GIXRD spectrum of an organic polymer RR-P3HT film (the concentration of the solution is 2.5 mg/ml upon the preparation of the RR-P3HT layer) prepared by a conventional film-forming method (out-of-plane mode, grazing incidence angle $\alpha=0.30°$).

After the poly(3-hexylthiophene) layer is manufactured in the method provided in an embodiment of the present disclosure, the mixing layer of semiconducting carbon nanotube and poly(3-hexylthiophene) is manufactured on the poly(3-hexylthiophene) layer. The method of manufacturing the carbon nanotube semiconductor layer comprises, for example: dissolving single-walled carbon nanotubes and poly(3-hexylthiophene) in an organic solvent, and the volume ratio of the single-walled carbon nanotubes and the poly(3-hexylthiophene), for example, ranges from 8:1 to 15:1, preferable 10:1, after ultrasonic mixing, then centrifugation separating, the rotation speed of centrifugation separating is from 13,000 to 15,000 rpm, and the time of centrifugation separating, for example, is from 5 to 10 minutes, and then the semiconducting carbon nanotubes wrapped by poly(3-hexylthiophene) are obtained, the mass content of the semiconducting carbon nanotubes accounting for the total carbon nanotube is equal to or greater than 99.9%, that is a purity of the semiconducting carbon nanotube is equal to or greater than 99.9%.

After the semiconducting carbon nanotubes wrapped by poly(3-hexylthiophene) are dissolved in an organic solvent, they are then coated on the surface of the poly(3-hexylthiophene) layer, after drying, the mixing layer of semiconducting carbon nanotube and poly(3-hexylthiophene) is obtained.

Figure 6:
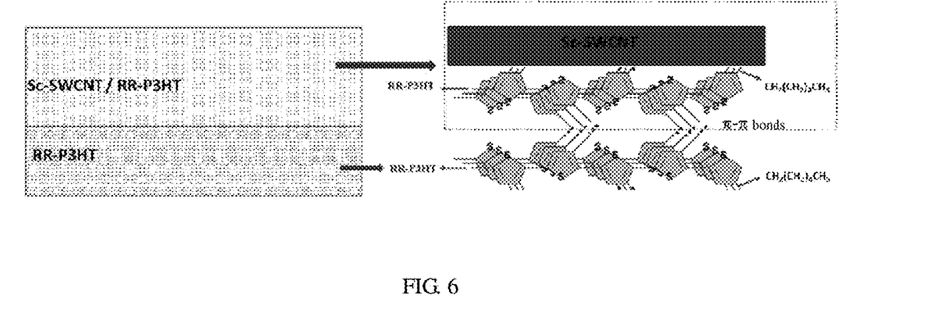
FIG. 6 is a schematic view of a three-dimensional channel of a semiconductor layer in a carbon nanotube thin film transistor provided by an embodiment of the present disclosure.

In an embodiment of the present disclosure, the poly(3-hexylthiophene) layer and the mixing layer of semiconducting carbon nanotube and poly(3-hexylthiophene) are connected through π-π bonds to form a three-dimensional channel of the semiconductor layer in the carbon nanotube thin film transistor. The manufactured carbon nanotube thin film transistor has good electrical properties. FIG. 6 is a schematic view of a three-dimensional channel of a semiconductor layer in a carbon nanotube thin film transistor provided by an embodiment of the present disclosure. In FIG. 6, RR-P3HT refers to the poly(3-hexylthiophene) layer and Sc-SWCNT/RR-P3HT refers to the mixing layer of semiconducting carbon nanotube and poly(3-hexylthiophene).

For example, in an embodiment of the present disclosure, the source electrode and the drain electrode are finally formed on the mixing layer of semiconducting carbon nanotube and poly(3-hexylthiophene). In the present disclosure, the material of the source electrode and the material of the drain electrode are not particularly limited, and palladium is acceptable. The manufacturing method of the source electrode and the drain electrode is also not particularly limited in the present disclosure, and the source electrode and the drain electrode may be prepared in the thermal evaporation method which is well known for those skilled in the art.

For example, in the process of manufacturing the carbon nanotube thin film transistor, finally, the elastic rubber used for supporting the flexible substrate is peeled off. The method of peeling off the elastic rubber is not particularly limited in the embodiments of the present disclosure.

In the present disclosure, the formation of the three-dimensional channel of the semiconductor layer in the carbon nanotube thin film transistor brings good electrical properties to the thin film transistor, such as a high mobility and a high on-off ratio. The thin film transistors having a full flexibility and an excellent biocompatibility are suitable for precision applications and measurement, particularly suitable for the fields of medical and wearable device, for example, the applications of medical monitoring and therapeutic devices in vitro or implanted in the human body.

In order to further understand the present disclosure, the carbon nanotube thin film transistor and the manufacturing method of the carbon nanotube thin film transistor provided by some embodiments of the present disclosure will be described below in detail with reference to the following examples. The scope of protection of the present disclosure is not limited by the following examples.

First Example

A fibroin flexible substrate is prepared on an elastic rubber in a solution method.

Afterwards, a gate electrode is prepared by a thermal evaporation method, and the material of the gate electrode, for example, is palladium.

PMMA is prepared by a solution method, and then an organic insulation layer is made of PMMA.

Poly(3-hexylthiophene) is dissolved in toluene with a concentration of 2.5 mg/L, the solution is applied onto the organic insulation layer by spin coating, vacuum annealed at the temperature of 150° C. for 10 minutes, and then allowed to stand in a vacuum condition at the room temperature for 20 hours, to obtain the poly(3-hexylthiophene) layer.

The single-walled carbon nanotubes with the mass concentration of semiconducting carbon nanotubes being 99% is ultrasonically mixed with the poly(3-hexylthiophene) with a volume ratio of 10:1 and centrifuged at 15,000 rpm for 5 minutes, to obtain the semiconducting carbon nanotubes wrapped with poly(3-hexylthiophene), and the purity of the semiconducting carbon nanotube is equal to or greater than 99.9%.

After the semiconducting carbon nanotubes wrapped with the poly(3-hexylthiophene) are dissolved in toluene, the solution is applied onto the surface of the poly(3-hexylthiophene) layer, and then dried to obtain the mixing layer of semiconducting carbon nanotube and poly(3-hexylthiophene).

A source electrode and a drain electrode are formed on the mixing layer of semiconducting carbon nanotube and poly (3-hexylthiophene) by a thermal evaporation method, and the material of the source electrode and the drain electrode is palladium.

The PDMS elastic rubber is peeled off to obtain the carbon nanotube thin film transistor.

The electrical properties of the carbon nanotube thin film transistor obtained by the method described above are tested, and its mobility can be up to 30 to 70 $cm^2/Vs$ and its on-off ratio is greater than $10^6$.

Second Example

A fibroin flexible substrate is prepared on an elastic rubber in a solution method.

Afterwards, a gate electrode is prepared in a thermal evaporation method, and the material of the gate electrode, for example, is palladium.

PMMA is prepared in a solution method, and then the organic insulation layer is made of PMMA.

Poly(3-hexylthiophene) is dissolved in toluene with a concentration of 3 mg/L, the solution is applied onto the organic insulation layer by spin coating, vacuum annealed at the temperature of 100° C. for 12 minutes, and then allowed to stand in a vacuum condition at the room temperature for 25 hours to obtain the poly(3-hexylthiophene) layer.

The single-walled carbon nanotube with semiconducting carbon nanotubes of 99 wt % are ultrasonically mixed with poly(3-hexylthiophene) in a volume ratio of 12:1 and centrifuged at 15,000 rpm for 5 minutes, to obtain semiconducting carbon nanotubes wrapped with poly(3-hexylthiophene), and the semiconducting carbon nanotubes have a content of equal to or greater than 99.9%.

After the semiconducting carbon nanotubes wrapped with poly(3-hexylthiophene) are dissolved in toluene, the solution is applied onto the surface of the poly(3-hexylthiophene) layer, and then dried to obtain the mixing layer of semiconducting carbon nanotube and poly(3-hexylthiophene).

A source electrode and a drain electrode are formed on the mixing layer of semiconducting carbon nanotube and poly (3-hexylthiophene) by a thermal evaporation method, and the material of the source electrode and the drain electrode is palladium.

The PDMS elastic rubber is peeled off to obtain the carbon nanotube thin film transistor.

The electrical properties of the carbon nanotube thin film transistor obtained by the method described above are tested, and its mobility can achieve from 30 to 70 cm$^2$/Vs and its on-off ratio is greater than $10^6$.

Third Example

A fibroin flexible substrate is prepared on an elastic rubber in a solution method.

Afterwards, a gate electrode is prepared by a thermal evaporation method, and the material of the gate electrode, for example, is palladium.

PMMA is prepared in a solution method, and then the organic insulation layer is made of PMMA.

Poly(3-hexylthiophene) is dissolved in toluene with a concentration of 5 mg/L, the solution is applied onto the organic insulation layer by spin coating, vacuum annealed at the temperature of 200° C. for 5 minutes, and then allowed to stand in a vacuum condition at the room temperature for 30 hours to obtain the poly(3-hexylthiophene) layer.

The single-walled carbon nanotubes with semiconducting carbon nanotubes of 99 wt % are ultrasonically mixed with poly(3-hexylthiophene) in a volume ratio of 8:1 and centrifuged at 13,000 rpm for 8 minutes, to obtain a semiconducting carbon nanotubes wrapped with poly(3-hexylthiophene), and the semiconducting carbon nanotubes have a content of equal to or greater than 99.9%.

After the semiconducting carbon nanotubes wrapped with the poly(3-hexylthiophene) are dissolved in toluene, the solution is applied on the surface of the poly(3-hexylthiophene) layer, and then dried to obtain the mixing layer of semiconducting carbon nanotube and poly(3-hexylthiophene).

A source electrode and a drain electrode are formed on the mixing layer of semiconducting carbon nanotube and poly (3-hexylthiophene) by a thermal evaporation method, and the material of the source electrode and the drain electrode is palladium.

PDMS elastic rubber is peeled off to obtain the carbon nanotube thin film transistor after the gate electrode, the semiconductor layer, the source electrode and the drain electrode are formed.

The electrical properties of the carbon nanotube thin film transistor obtained by the method described above are tested, and its mobility can achieve from 30 to 70 cm$^2$/Vs and its switching ratio is greater than $10^6$.

The carbon nanotube thin film transistor and the manufacturing method thereof provided by the embodiments of the present disclosure have the following technical effects. The semiconductor layer of the carbon nanotube thin film transistor comprises the poly(3-hexylthiophene) layer and the mixing layer of semiconducting carbon nanotube and poly(3-hexylthiophene). The mixing layer of semiconducting carbon nanotube and poly(3-hexylthiophene) has a high content of semiconducting carbon nanotubes, thus the metallic carbon nanotubes are substantially cleared out and the electrical property of the thin film transistor is ensured. Furthermore, the mixing layer of semiconducting carbon nanotube and poly(3-hexylthiophene) and the poly(3-hexylthiophene) layer are connected through π-π bonds to form a three-dimensional channel of the semiconductor layer in the carbon nanotube thin film transistor, so that the manufactured carbon nanotube thin film transistor has good electrical properties, such as a high mobility and a high switching ratio.

Further, the base substrate of the carbon nanotube thin film transistor can be made of a flexible material, the thin film transistors having flexible substrates are suitable for precision applications and measurement, particularly suitable for the fields of medical and wearable device, for example, the applications of medical monitoring and therapeutic devices in vitro or implanted in the human body.

Obviously, those skilled in the art may make various modifications and variations to the present disclosure but not departing from the spirit and scope of the disclosure. Thus, if these modifications and variations of the present disclosure belong to the scope of the claims of the disclosure and their equivalents technology, the present disclosure is also intend to include these modifications and variations.

What are described above is related to the illustrative embodiments of the disclosure only and not limitative to the scope of the disclosure; the scopes of the disclosure are defined by the accompanying claims.

The present application claims the priority of the Chinese Patent Application No. 201610011912.8 filed on Jan. 8, 2016, which is incorporated herein by reference as part of the disclosure of the present application.

What is claimed is:

1. A carbon nanotube thin film transistor, comprising: a base substrate; a gate electrode, a semiconductor layer, a source electrode and a drain electrode, which are disposed on the base substrate,
   wherein the semiconductor layer comprises a poly(3-hexylthiophene) layer and a mixing layer of semiconducting carbon nanotube and poly(3-hexylthiophene) which are stacked;
   the carbon nanotube thin film transistor further comprises an insulation layer disposed between the gate electrode and the semiconductor layer, wherein the poly(3-hexylthiophene) layer is disposed between the insulation layer and the mixing layer of semiconducting carbon nanotube and poly(3-hexylthiophene).

2. The carbon nanotube thin film transistor according to claim 1, wherein the base substrate is a flexible substrate.

3. The carbon nanotube thin film transistor according to claim 2, wherein the flexible substrate is a fibroin flexible substrate.

4. The carbon nanotube thin film transistor according to claim 2, wherein the mixing layer of semiconducting carbon nanotube and poly(3-hexylthiophene) is formed of semiconducting carbon nanotubes wrapped by the poly(3-hexylthiophene).

5. The carbon nanotube thin film transistor according to claim 1, wherein the mixing layer of semiconducting carbon nanotube and poly(3-hexylthiophene) formed of semiconducting carbon nanotubes wrapped by the poly(3-hexylthiophene).

6. The carbon nanotube thin film transistor according to claim 5, wherein in the semiconducting carbon nanotubes wrapped by the poly(3-hexylthiophene), a purity of the semiconducting carbon nanotubes is equal to or greater than 99.9%.

7. The carbon nanotube thin film transistor according to claim 1, wherein the insulation layer is an organic insulation layer.

8. A manufacturing method of a carbon nanotube thin film transistor, comprising:

preparing a base substrate; and forming a gate electrode, a semiconductor layer, a source electrode, and a drain electrode on the base substrate;

wherein a process of forming the semiconductor layer comprises:

preparing a poly(3-hexylthiophene) layer and a mixing layer of semiconducting carbon nanotube and poly(3-hexylthiophene), which are stacked on the base substrate;

the carbon nanotube thin film transistor further comprises an insulation layer disposed between the gate electrode and the semiconductor layer, wherein the poly(3-hexylthiophene) layer is disposed between the insulation layer and the mixing layer of semiconducting carbon nanotube and poly(3-hexylthiophene).

9. The manufacturing method according to claim 8, wherein a process of forming the poly(3-hexylthiophene) layer comprises:

dissolving poly(3-hexylthiophene) in an organic solvent, then applying onto the base substrate, vacuum annealing, standing in a vacuum condition at a room temperature.

10. The manufacturing method according to claim 9, wherein the vacuum annealing is carried out at a temperature of 25° C. to 240° C. for 5 to 15 minutes.

11. The manufacturing method according to claim 9, wherein a process of standing is carried out in a vacuum condition at the room temperature for 20 to 30 hours.

12. The manufacturing method according to claim 8, wherein a process of preparing the mixing layer of semiconducting carbon nanotube and poly(3-hexylthiophene) comprises:

dissolving single-walled carbon nanotubes and poly(3-hexylthiophene) in an organic solvent, ultrasonic mixing, centrifugation separating to form semiconducting carbon nanotubes wrapped by poly(3-hexylthiophene); and dissolving the semiconducting carbon nanotubes wrapped by poly(3-hexylthiophene) in an organic solvent, applying onto a surface of the poly(3-hexylthiophene) layer, and drying to obtain the mixing layer of semiconducting carbon nanotube and poly(3-hexylthiophene).

13. The manufacturing method according to claim 12, wherein a rotation speed of centrifugation separating is from 13,000 to 15,000 rpm and a time period of centrifugation separating is from 5 to 10 minutes.

14. The manufacturing method according to claim 12, wherein in the mixing layer of semiconducting carbon nanotube and poly(3-hexylthiophene), a purity of the semiconducting carbon nanotubes is equal to or greater than 99.9%.

15. The manufacturing method according to claim 12, wherein a volume ratio of the single-walled carbon nanotubes to the poly(3-hexylthiophene) is from 8:1 to 15:1.

16. The manufacturing method according to claim 12, wherein a volume ratio of the single-walled carbon nanotubes to the poly(3-hexylthiophene) is from 8:1 to 15:1.

17. The manufacturing method according to claim 8, wherein preparing of the base substrate comprises:

preparing a fibroin flexible substrate on an elastic rubber in a solution method.

18. The manufacturing method according to claim 17, further comprising: peeling off the elastic rubber after the gate electrode, the semiconductor layer, the source electrode, and the drain electrode are formed.

* * * * *